(12) United States Patent
Hutcheson

(10) Patent No.: US 8,836,602 B2
(45) Date of Patent: Sep. 16, 2014

(54) TUNABLE BROADBAND ANTENNA MATCHING CIRCUITS AND DEVICES USING SAME

(75) Inventor: George Zohn Hutcheson, Richardson, TX (US)

(73) Assignee: Samsung Electronics Co., Ltd., Suwon-Si (KR)

( * ) Notice: Subject to any disclaimer, the term of this patent is extended or adjusted under 35 U.S.C. 154(b) by 302 days.

(21) Appl. No.: 13/355,220

(22) Filed: Jan. 20, 2012

(65) Prior Publication Data

US 2013/0187826 A1    Jul. 25, 2013

(51) Int. Cl.
*H01Q 1/50* (2006.01)
(52) U.S. Cl.
USPC ........................................... 343/860
(58) Field of Classification Search
USPC ........... 343/860, 867, 725–726; 455/107, 126
See application file for complete search history.

(56) References Cited

U.S. PATENT DOCUMENTS

| | | | | |
|---|---|---|---|---|
| 6,845,126 B2 * | 1/2005 | Dent et al. | ..................... | 375/219 |
| 7,215,292 B2 * | 5/2007 | McLean | ........................ | 343/725 |
| 7,865,154 B2 * | 1/2011 | Mendolia et al. | ............. | 455/125 |
| 8,351,874 B2 * | 1/2013 | Dent et al. | ..................... | 455/107 |
| 8,620,247 B2 * | 12/2013 | McKinzie et al. | ......... | 455/248.1 |

* cited by examiner

*Primary Examiner* — Huedung Mancuso

(57) ABSTRACT

An improved wireless radio-frequency (RF) transmission system is disclosed. The wireless RF transmission system comprises: 1) a radio frequency (RF) transceiver configured to transmit and receive radio-frequency signals; ii) an electrically small antenna having a complex impedance comprising a real part and an imaginary part; and iii) a tunable negative impedance converter (NIC) circuit coupling the electrically small antenna to the RF transceiver. The tunable NIC circuit is configured to perform antenna matching by reducing the imaginary part of the complex impedance of the electrically small antenna. The tunable NIC circuit is tuned by adjusting a transconductance value associated with the tunable NIC circuit.

19 Claims, 3 Drawing Sheets

TUNABLE BROADBAND ANTENNA MATCHING CIRCUITS AND DEVICES USING SAME

TECHNICAL FIELD OF THE INVENTION

The present application relates generally to wireless transmitters and receivers and, more specifically, to a tunable broadband antenna matching circuit for use with an electrically small antenna having physical dimensions less than the operating wavelength of the wireless device.

BACKGROUND OF THE INVENTION

An antenna with physical dimensions less than the operating wavelength of the antenna, frequently called and "electrically small antenna" or "ESA", exhibits complicated electrical impedances at the antenna feed-points. These complicated impedances prevent the efficient transfer of radio-frequency (RF) power to and from the antenna feed-points and the radiating electromagnetic fields and limit the throughput of data or information carried on the physical layer of wireless networks.

The following reference (REF) documents are incorporated by reference into the present disclosure as if fully set forth herein: i) REF1—M. Gustafsson, C. Sohl, and G. Kristensson, "Illustrations Of New Physical Bounds On Linearly Polarized Antennas", IEEE Transactions on Antennas Propagation, vol. 57, pp. 1319-1327, May 2009; ii) REF2—R. E. Collins, "Foundations For Microwave Engineering", Ch. 5, IEEE Press, 2001; iii) REF3—J. Holopainen, "Handheld DVB And Multisystem Radio Antennas", Thesis, Helsinki University of Technology, April 2008; iv) REF4—X. Zhu and M. Brobston, "System And Method For A Digitally Tunable Impedance Matching Network", U.S. Pat. No. 7,332,980, February 2008; v) REF5—M. Brobston, X. Zhu, and S. E. Kim, "System And Method For A Digitally Tunable Impedance Matching Network", U.S. Pat. No. 7,671,693, March 2010; vi) REF6—G. Skahill, R. M. Rudish, J. A. Pierro, "Apparatus And Method For Broadband Matching Of Electrically Small Antennas", U.S. Pat. No. 6,121,940, September 2000; vii) REF7—S. E. Sussman-Fort and R. M. Rudish, "Non-Foster Impedance Matching Of Electrically-Small Antennas", IEEE Transactions on Antennas Propagation, vol. 57, pp. 2230-2241, August 2009; and viii) REF8—S. Y. Liao, Microwave Devices and Circuits, 3rd ed., Prentice-Hall, Inc., Englewood Cliffs, N.J., 1990.

As described in REF1, the feed-point impedances of electrically small antennas have several distinctive and undesirable characteristics: i) a small real part of the complex impedance (typically less than 50 ohms); ii) a negative imaginary part of the complex impedance (or capacitive impedance); iii) a narrow bandwidth; and iv) a large quality (or Q) factor.

Several technologies and techniques are currently used to address the feed-point impedance problems with ESA's. These include passive matching networks (e.g., REF2, REF3), tunable matching networks (TMN) (e.g., REF4, REF5), and negative impedance converters (NIC) circuits (e.g., REF6, REF7). All three forms involve some mechanism that transforms the undesirable impedance at the antenna feed-point to an impedance that conjugate matches that of the transceiver circuit connected to the antenna feed-point. Passive matching networks utilize fully passive components (inductors, capacitors, transformers, transmission lines, etc.) to achieve the impedance transformation but are limited to one or a few specific frequencies and may further reduce the operating bandwidth below that of the antenna alone.

Tunable matching networks (TMN) utilize variable components (e.g., variable capacitors and/or variable inductors) in conventional matching network topologies to provide frequency agile or flexible antenna matching that is not available in traditional passive matching networks. But, as with passive matching, the bandwidth of tunable matching networks may be less than the bandwidth of the antenna without matching and the bandwidth may be less than that specified by the application requirements. Negative impedance converter (NIC) circuits utilize active circuits that masquerade as negative passive components. Negative capacitors or inductors are placed in series, shunt, or combinations thereof with the feed-points of antennas to cancel out the imaginary part (capacitance or inductance) of the antenna impedances. Negative impedance circuit matching provides broadband matching at a single center frequency or within a single frequency band but cannot provide effective matching across multiple frequency bands.

However, new wireless and cellular equipment must operate across multiple and disparate frequency bands and, within those bands, must function across wide bandwidths. Present antenna matching technologies do not provide adequate or effective means to address both the bandwidth and frequency agility demanded of new wireless systems.

SUMMARY OF THE INVENTION

To address the above-discussed deficiencies of the prior art, it is a primary object to provide an improved wireless radio-frequency (RF) transmission system. The wireless RF transmission system comprises: 1) a radio frequency (RF) transceiver configured to transmit and/or receive radio-frequency signals; ii) an electrically small antenna having a complex impedance comprising a real part and an imaginary part; and iii) a tunable negative impedance converter (NIC) circuit coupling the electrically small antenna to the RF transceiver. The tunable NIC circuit is configured to perform antenna matching by reducing the imaginary part of the complex impedance of the electrically small antenna. According to an advantageous embodiment of the present disclosure, the tunable NIC circuit is tuned by adjusting a transconductance value associated with the tunable NIC circuit or by changing a tunable element within the NIC circuit.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION OF THE INVENTION

FIGS. 1 through 5, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged radio frequency (RF) transmitter and/or receiver.

Figure 1:
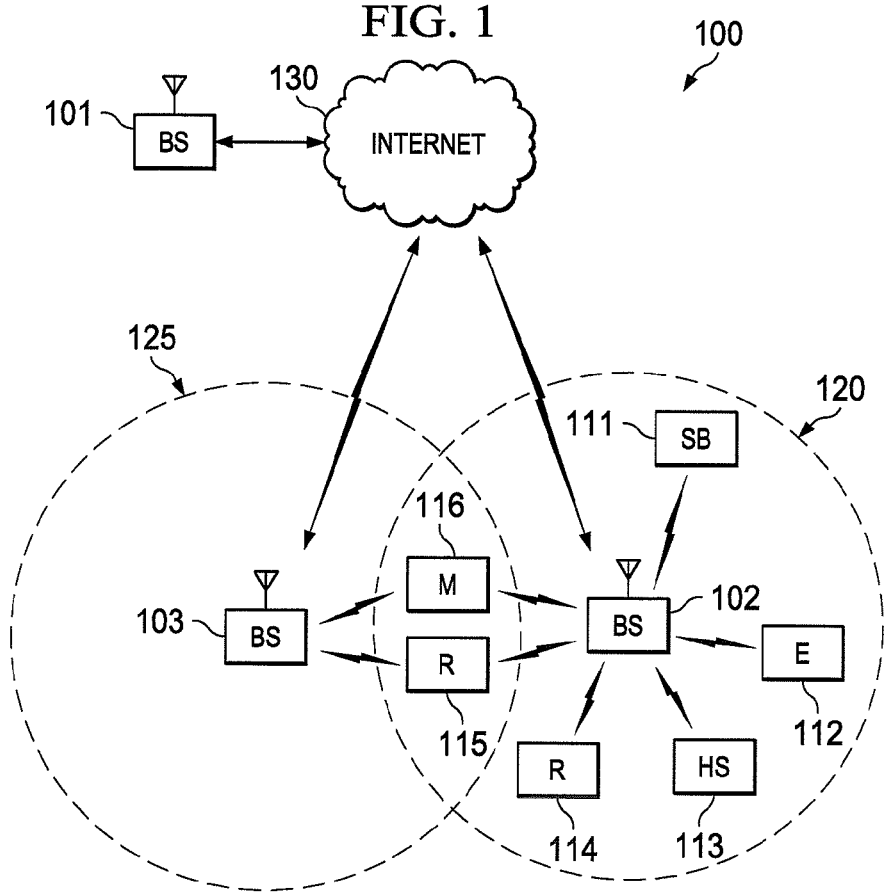
FIG. 1 illustrates an exemplary wireless network that includes mobile stations that implement tunable broadband antenna matching according to the principles of the present disclosure.

FIG. 1 illustrates exemplary wireless network 100, which includes mobile stations that implement tunable broadband antenna matching according to the principles of the present disclosure. Wireless network 100 includes base station (BS) 101, base station (BS) 102, base station (BS) 103, and other similar base stations (not shown). Base station 101 is in communication with Internet 130 or a similar IP-based network (not shown).

Depending on the network type, other well-known terms may be used instead of "base station," such as "eNodeB" or "access point". For the sake of convenience, the term "base station" shall be used herein to refer to the network infrastructure components that provide wireless access to remote terminals.

Base station 102 provides wireless broadband access to Internet 130 to a first plurality of mobile stations within coverage area 120 of base station 102. The first plurality of subscriber stations includes mobile station 111, which may be located in a small business (SB), mobile station 112, which may be located in an enterprise (E), mobile station 113, which may be located in a WiFi hotspot (HS), mobile station 114, which may be located in a first residence (R), mobile station 115, which may be located in a second residence (R), and mobile station 116, which may be a mobile device (M), such as a cell phone, a wireless laptop, a wireless PDA, or the like.

Base station 103 provides wireless broadband access to Internet 130 to a second plurality of mobile stations in coverage area 125 of base station 103. The second plurality of mobile stations includes mobile station 115 and mobile station 116. In an exemplary embodiment, base stations 101-103 may communicate with each other and with mobile stations 111-116 using narrowband or broadband techniques, and frequency division duplexing (FDD) or time division duplexing (TDD) techniques.

The exemplary tunable broadband antenna matching circuits and techniques disclosed herein may be implemented in a wide variety of radio frequency (RF) transmission devices, including, but not limited to, both the mobile stations and the base stations in FIG. 1 above. For the purposes of conciseness and simplicity, a transceiver implementing tunable broadband antenna matching according to the principles of the present disclosure will be described below implemented in a mobile station. However, this exemplary embodiment should not be construed to limit the scope of the claims herein. The exemplary transceiver using tunable broadband antenna matching may also be implemented in a base station, a relay station, a WiFi access point, and the like.

Figure 2:
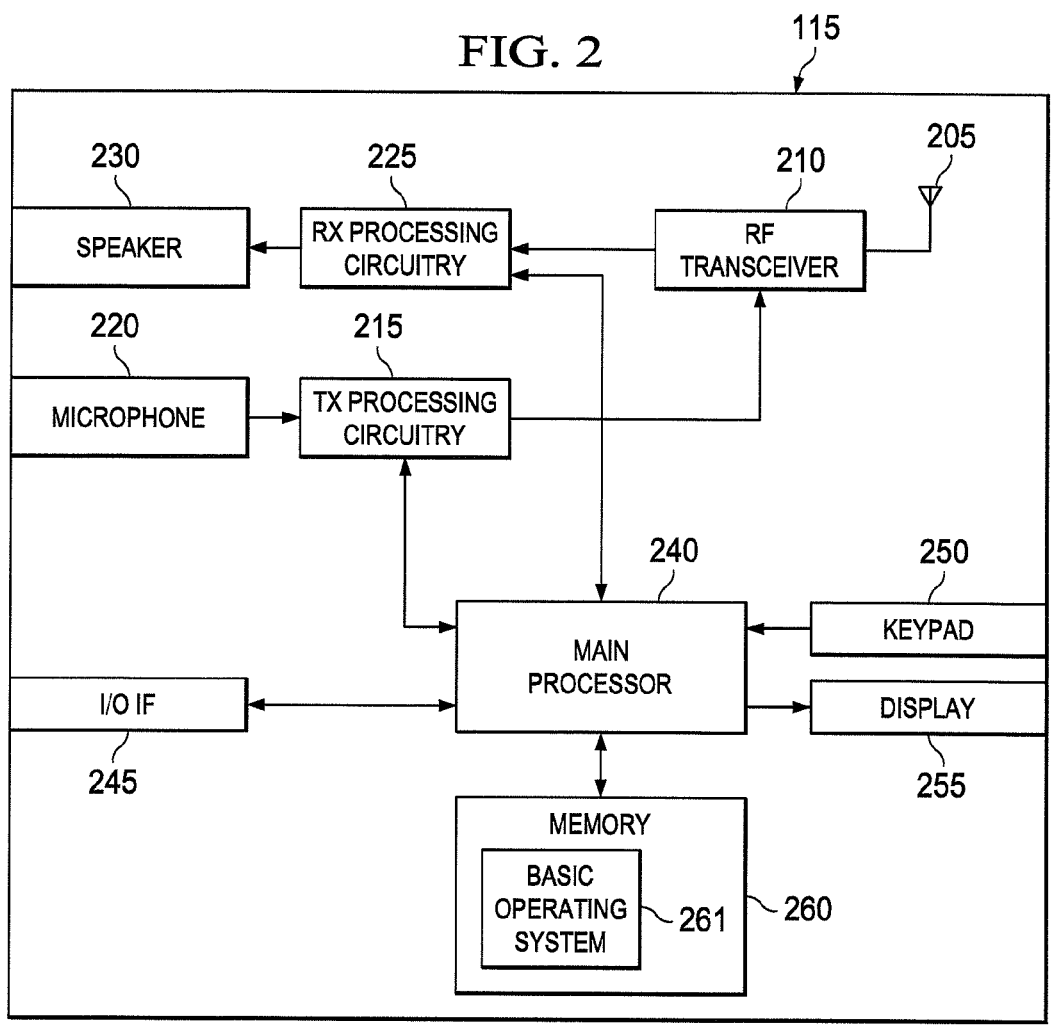
FIG. 2 illustrates a wireless mobile station that includes tunable broadband antenna matching according to the principles of the present disclosure.

FIG. 2 illustrates wireless mobile station 115, which includes tunable broadband antenna matching according to the principles of the present disclosure. Wireless mobile station 115 comprises antenna 205, radio frequency (RF) transceiver 210, transmit (TX) processing circuitry 215, microphone 220, and receive (RX) processing circuitry 225. MS 115 also comprises speaker 230, main processor 240, input/output (I/O) interface (IF) 245, keypad 250, display 255, and memory 260. Memory 260 further comprises basic operating system (OS) program 261.

Radio frequency (RF) transceiver 210 receives from antenna 205 an incoming RF signal transmitted by a base station of wireless network 100. Radio frequency (RF) transceiver 210 down-converts the incoming RF signal to produce a baseband signal. The baseband signal is sent to receiver (RX) processing circuitry 225, which produces a processed baseband signal by filtering and digitizing the baseband signal and, if necessary, demodulating and/or decoding. Receiver (RX) processing circuitry 225 transmits the processed baseband signal to speaker 230 (i.e., voice data) or to main processor 240 for further processing (e.g., web browsing).

Transmitter (TX) processing circuitry 215 receives analog or digital voice data from microphone 220 or other outgoing baseband data (e.g., web data, e-mail, interactive video game data) from main processor 240. Transmitter (TX) processing circuitry 215 encodes, modulates, multiplexes, and/or digitizes the outgoing baseband data to produce a processed baseband signal. Radio frequency (RF) transceiver 210 receives the outgoing processed baseband signal from transmitter (TX) processing circuitry 215. Radio frequency (RF) transceiver 210 up-converts the baseband signal to an IF signal and then to a radio frequency (RF) signal that is transmitted via antenna 205.

In an advantageous embodiment of the present disclosure, main processor 240 is a microprocessor or microcontroller. Memory 260 is coupled to main processor 240. According to an advantageous embodiment of the present disclosure, part of memory 260 comprises a random access memory (RAM) and another part of memory 260 comprises a non-volatile memory, such as Flash memory, which acts as a read-only memory (ROM).

Main processor 240 executes basic operating system (OS) program 261 stored in memory 260 in order to control the overall operation of wireless mobile station 115. In one such operation, main processor 240 controls the reception of forward channel signals and the transmission of reverse channel signals by radio frequency (RF) transceiver 210, receiver (RX) processing circuitry 225, and transmitter (TX) processing circuitry 215, in accordance with well-known principles.

Main processor 240 is capable of executing other processes and programs resident in memory 260. Main processor 240 can move data into or out of memory 260, as required by an executing process. Main processor 240 is also coupled to I/O interface 245. I/O interface 245 provides mobile station 115 with the ability to connect to other devices such as laptop computers and handheld computers. I/O interface 245 is the communication path between these accessories and main controller 240.

Main processor 240 is also coupled to keypad 250 and display unit 255. The operator of mobile station 115 uses keypad 250 to enter data into mobile station 115. Display 255 may be a liquid crystal display capable of rendering text and/or at least limited graphics from web sites. Alternate embodiments may use other types of displays.

In FIG. 2, it is assumed that antenna 205 has physical dimensions less than the operating wavelength of antenna 205 (i.e., antenna 205 is an electrically small antenna). Accordingly, antenna matching may be implemented in RF transceiver 210 to perform antenna matching with antenna 205.

The present disclosure provides an electronically tunable broadband match for electrically small antennas using tunable negative impedance converter (NIC) circuits. Electromagnetism (at least, classical electrodynamics) denies the realization of negatively-valued passive components. However, negatively valued components may be constructed from transistor (or similarly active) circuits. An NIC transistor circuit forces a 180 degree phase difference between the input current and voltage as compared to that of the normally positive-valued component. For many NIC circuits, the sizes of the negative component values created by the NIC circuits are dependent upon the transistor transconductance values within the circuit. The negative component values may be varied or adjusted by changing the transistor transconductance of the particular NIC circuit. The transconductance for a field-effect transistor (FET) or a biased-junction transistor (BJT) is sensitive to the drain or collector bias (DC) current. Antenna matching is achieved by placing an NIC circuit in the antenna feed to negate or cancel the imaginary part of the antenna impedance. The match with the NIC circuit is made tunable by changing the transistor bias, transconductance, and negative component value. Optimum match is realized when the circuit bias current is set to a value where the negative component value completely cancels the antenna imaginary impedance.

Figure 3:
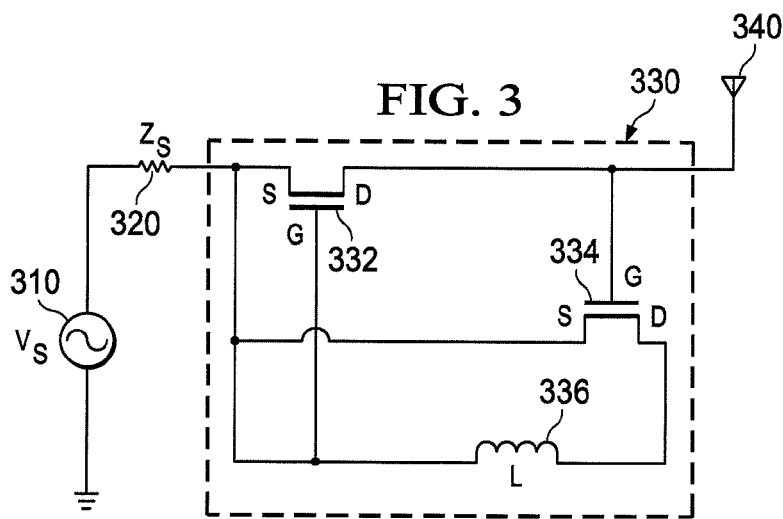
FIG. 3 illustrates antenna matching with a tunable broadband matching circuit according to one embodiment of the present disclosure.

FIG. 3 illustrates antenna matching with a tunable broadband matching circuit according to the principles of the present disclosure. FIG. 3 includes signal generator 310, resistor 320, NIC circuit 330 and antenna 340. Signal generator 310 represents the source signal, $V_S$, and resistor 320 represents the source impedance, $Z_S$, from, for example, RF transceiver 210.

In FIG. 3, one form of a negative impedance converter (NIC) 330 providing a negative capacitor using FETs is shown. NIC circuit 330 comprises FET 332, FET 334 and inductor 336, having an inductance, L. The source and gate of FET 332, the source of FET 334, and a first end of inductor 336 are coupled together. The drain of FET 332 is coupled to the gate of FET 334 and to antenna 340. The drain of FET 334 is coupled to a second end of inductor 336. This configuration of NIC circuit 330 provides a tunable negative capacitance.

The negative capacitor is placed in series between RF transceiver 210 and electrically small antenna 340. RF transceiver 210 is shown as a transmitter but could be replaced by a receiver without loss of generality. The negative capacitor of NIC circuit 330 negates the large positive capacitance of the electrically small antenna 340 and ensures that the impedance presented to RF transceiver 210 is real.

As described above, the transistor transconductance is important in adjusting or tuning the negative impedance converter to the desired negative component value. Transconductance may be defined as the ratio of the output current change to the input voltage change of an active device (e.g., a transistor):

$$g_m = \partial i_{out}/\partial V_{in}.$$ [Eqn. 1]

In Equation 1, $g_m$ is the transconductance, $i_{out}$ is the time varying output current, $v_{in}$ is the time varying input voltage, and ∂ indicates partial derivative. For a field-effect transistor (FET) in common source configuration, the transconductance may be more narrowly defined as the ratio of the drain current change to the gate-to-source voltage change:

$$g_m = \partial i_D/\partial V_{GS}.$$ [Eqn. 2]

In Equation 2, $i_D$ is the time-varying drain current and $v_{GS}$ is the time-varying gate-to-source voltage. For brevity, the exact derivation of the transconductance of a FET is not given here. However, the expression for the transconductance of a common source FET circuit is as follows (see REF8):

$$g_m = 2I_D/(V_{GS} - V_{th}).$$ [Eqn. 3]

In Equation 3, $I_D$ is the DC drain current at the Q or DC bias point, $V_{GS}$ is the DC gate-to-source voltage at the Q or DC bias point, and $V_{th}$ is the threshold voltage of the transistor (an inherent property of the device). Similarly, the expression for the transconductance of a common emitter bipolar transistor circuit is as follows (see REF8):

$$g_m = \partial i_C/\partial V_{BE} = I_C/V_T,$$ [Eqn. 4]

In Equation 4, $i_C$ is the time-varying collector current, $v_{BE}$ is the time-varying base-to-emitter voltage, $I_C$ is the DC collector current at the Q or DC bias of the circuit, and $V_T$ is the thermal voltage of the transistor (an inherent property of bipolar transistors). The expressions above for either the common source FET or common emitter bipolar transistor circuits show that the transconductance of either is directly proportional to the DC bias current through the circuit.

Therefore, the equivalent negative component value of a negative impedance converter circuit may be controlled by adjusting the DC bias current of the transistor circuit forming the negative impedance converter. For illustrative purposes, the transconductance of the two most common active device types has been described but should not be taken as the only devices that may be used for this invention.

Figure 4:
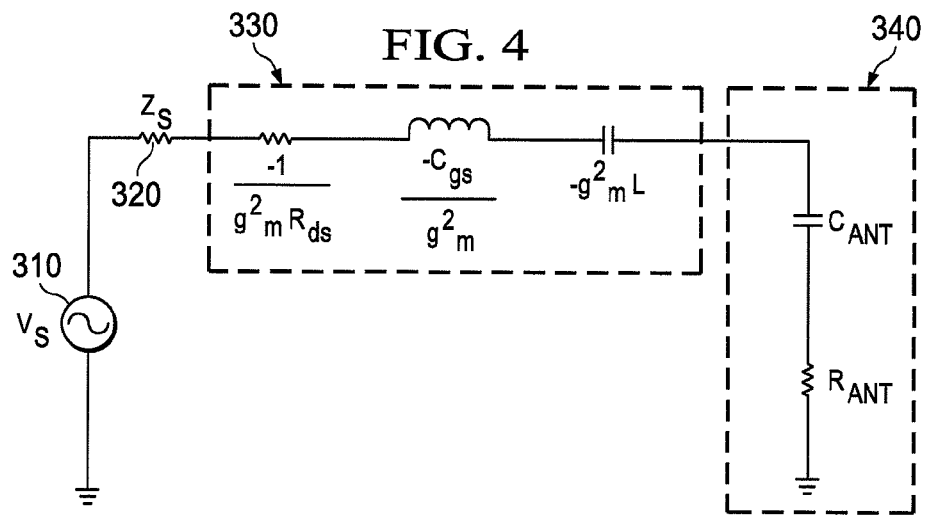
FIG. 4 illustrates a small signal equivalent circuit of the transistor NIC circuit of FIG. 3.

FIG. 4 illustrates a small signal equivalent circuit of the transistor NIC circuit 330 of FIG. 3. The small signal equivalent of NIC circuit 330 is a series combination of a resistor, an inductor, and a capacitor having the values shown. The antenna is shown as a series connection of a resistor and a capacitor. The definitions of the terms in FIG. 3 are: i) gm is the transistor transconductance, ii) $C_{gs}$ is the gate-to-source capacitance, iii) $R_{ds}$ is the drain-to-source resistance, iv) $C_{ANT}$ is the capacitance of the ESA antenna impedance, and v) $R_{ANT}$ is the real part of the ESA antenna impedance. Effectively, inductor 336 of NIC circuit 330 is converted into a negative capacitor. The negative capacitor dominates the simplified NIC circuit 330, since the drain-to-source resistance ($R_{ds}$) of the FET is typically large and the gate-to-source capacitance (Cgs) of the FET is small.

It is important to note the dependence of the negative capacitance, $(-g_m)^2 L$, on the transconductance, $g_m$, of NIC circuit 330. Since the transconductance can be easily varied and controlled by changing the bias current, $I_{DD}$, of the NIC transistors, the antenna matching provided by NIC circuit 330 may be tuned to minimize or to negate the capacitance of ESA antenna 340. Moreover, the squared term of the transconductance in the negative capacitance allows a wide tuning range of the negative capacitance with minimal impact on the overall bias of the NIC.

By varying the bias current of NIC circuit 330, the strong positive capacitance of an electrically small antenna may be removed over a wide range of frequencies. The already broadband antenna matching improvement provided by negative impedance circuits is enhanced with the capability of extending and controlling the range of frequencies where the broadband matching may be applied. This provides both broadband and wide frequency tuning of the antenna matching.

Figure 5:
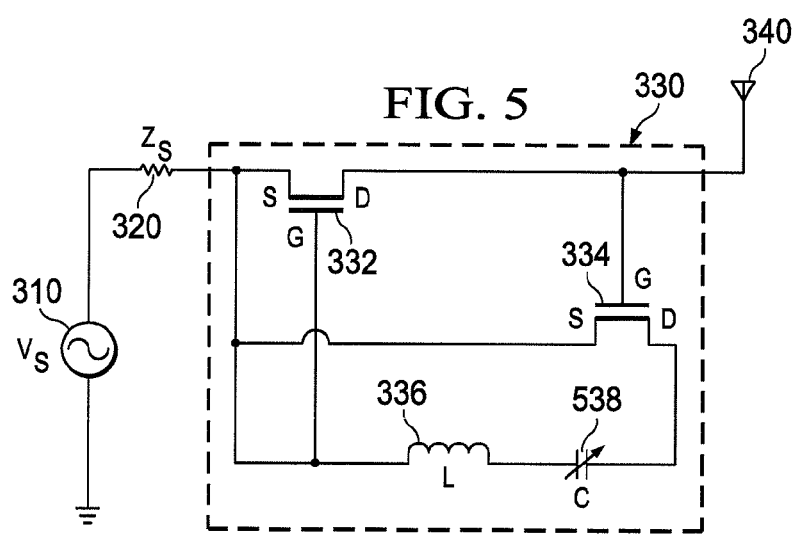
FIG. 5 illustrates antenna matching with a tunable broadband matching circuit according to an alternate embodiment of the present disclosure.

FIG. 5 illustrates antenna matching with a tunable broadband matching circuit according to an alternate embodiment of the present disclosure. Alternative embodiments may include tunable devices placed either in series or in parallel with the primary component in NIC circuit 330 used to realize the negative component value. The embodiment in FIG. 5 is similar to FIG. 3, with the exception of the electronically tunable capacitor 538 in NIC circuit 330.

In FIG. 5, the imaginary impedance of a fixed inductor and a variable capacitor provides a tunable negative capacitor in series with the antenna feed-point. Tunable devices placed in NIC circuit 330 may include MEMS base tunable capacitors and/or inductors, Ferro-electric tunable capacitors, silicon-on-sapphire tunable capacitors, varactor diode tunable capacitors, and other variable impedance devices. Variable positive components placed in NIC circuit 330 with varying of the transistor circuit biasing is yet another embodiment of this disclosure.

The disclosed tunable broadband matching circuit improves RF performance for either a mobile station (i.e., handset) or a base station. For frequency bands below 1 GHz, handsets are typically smaller than the operating RF wavelength resulting in considerable loss of antenna performance or poor transfer of RF power to and from the antenna. The disclosed tunable broadband matching circuit provides a means to improve the performance of handset antennas and to improve the signal quality and data throughput of handset products beyond the capabilities of present technologies. The disclosed tunable broadband matching circuit provides i) improved antenna performance with handsets of existing antenna sizes; ii) reduction in the size of handset antennas with no degradation of antenna performance over existing products; and iii) improved antenna performance in the presence of nearby objects (e.g., head, hand, table tops, etc.).

Alternate embodiment may be applied to base stations or other infrastructure products requiring small antennas to meet aesthetic or packaging constraints. The disclosed tunable broadband matching circuit compensates for the reduced system performance caused by the reduction in antenna size. The disclosed tunable broadband matching circuit also allows smaller antennas with no reduction in system or radiation performance for femto-cell and pico-cell base station antennas.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A mobile station capable of communicating with a base station of a wireless network, the mobile station comprising:
a radio frequency (RF) transceiver configured to at least one of transmit and receive radio-frequency signals;
an electrically small antenna having a complex impedance comprising a real part and an imaginary part; and
a tunable negative impedance converter (NIC) circuit configured to be tuned by adjusting at least one of a capacitance value of a variable capacitor associated with the tunable NIC circuit and an inductance value of a variable inductor, and coupling the electrically small antenna to the RF transceiver, wherein the tunable NIC circuit is configured to perform antenna matching by reducing the imaginary part of the complex impedance of the electrically small antenna.

2. The mobile station wireless RF transmission system as set forth in claim 1, wherein the transconductance value is a transconductance value of an active component associated with the tunable NIC circuit.

3. The mobile station as set forth in claim 2, wherein the active component associated with the tunable NIC circuit is a transistor.

4. The mobile station as set forth in claim 3, wherein the transistor is one of: i) a field effect transistor and ii) a biased-junction transistor.

5. The mobile station as set forth in claim 3, wherein the transconductance value associated with the tunable NIC circuit is adjusted by changing a bias voltage of the transistor.

6. The wireless RF transmission system as set forth in claim 3, wherein the tunable NIC circuit comprises a second transistor.

7. The wireless RF transmission system as set forth in claim 6, wherein a source and a gate of the transistor are coupled to a second source of the second transistor.

8. The wireless RF transmission system as set forth in claim 6, wherein a drain of the transistor is coupled to a gate of the second transistor.

9. A mobile station capable of communicating with a base station of a wireless network, the mobile station comprising:
a radio frequency (RF) transceiver configured to at least one of transmit and receive radio-frequency signals;
an electrically small antenna having a complex impedance comprising a real part and an imaginary part; and
a tunable negative impedance converter (NIC) circuit configured to be tuned by adjusting a transconductance value and coupling the electrically small antenna to the mobile station, wherein the tunable NIC circuit is configured to perform antenna matching by reducing the imaginary part of the complex impedance of the electrically small antenna.

10. The mobile station as set forth in claim 9, wherein the transconductance value is a transconductance value of an active component associated with the tunable NIC circuit.

11. The mobile station as set forth in claim 10, wherein the active component associated with the tunable NIC circuit is a transistor.

12. The mobile station as set forth in claim 11, wherein the transistor is one of: i) a field effect transistor and ii) a biased junction transistor.

13. The mobile station as set forth in claim 11, wherein the transconductance value associated with the tunable NIC circuit is adjusted by changing a bias voltage of the transistor.

14. The mobile station as set forth in claim 9, wherein the tunable NIC circuit is tuned by adjusting a capacitance value of at least one of a variable capacitor associated with the tunable NIC circuit and an inductance value of a variable inductor.

15. A method for wireless radio-frequency (RF) transmission comprising:
at least one of transmitting and receiving radio-frequency signals using:
an electrically small antenna having a complex impedance comprising a real part and an imaginary part; and
a tunable negative impedance converter (NIC) circuit configured to be tuned by adjusting a transconductance value and coupling the electrically small antenna to the RF transceiver; and performing antenna matching by reducing the imaginary part of the complex impedance of the electrically small antenna.

16. The method as set forth in claim 15, wherein the transconductance value is a transconductance value of an active component associated with the tunable NIC circuit.

17. The method as set forth in claim 16, wherein the active component associated with the tunable NIC circuit is a transistor.

18. The method as set forth in claim 17, wherein the transconductance value associated with the tunable NIC circuit is adjusted by changing a bias voltage of the transistor.

19. The method as set forth in claim 15, further comprising tuning the tunable NIC circuit by adjusting at least one of a capacitance value of a variable capacitor associated with the tunable NIC circuit and an inductance value of a variable inductor.

* * * * *